United States Patent
Kim

(10) Patent No.: US 8,621,292 B2
(45) Date of Patent: Dec. 31, 2013

(54) DEVICE AND METHOD FOR TESTING SEMICONDUCTOR DEVICE

(75) Inventor: Jung Rae Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/491,056

(22) Filed: Jun. 7, 2012

(65) Prior Publication Data

US 2012/0317449 A1    Dec. 13, 2012

(30) Foreign Application Priority Data

Jun. 9, 2011    (KR) .................. 10-2011-0055427

(51) Int. Cl.
    *G11C 29/10*    (2006.01)
    *G11C 29/54*    (2006.01)

(52) U.S. Cl.
    USPC .......................................... 714/718; 714/738

(58) Field of Classification Search
    None
    See application file for complete search history.

(56) References Cited

U.S. PATENT DOCUMENTS

| 5,109,497 A * | 4/1992 | Bolstad et al. ............... 711/200 |
| 6,724,668 B2 * | 4/2004 | Ohmura et al. ............... 365/200 |
| 8,125,843 B2 * | 2/2012 | Konda .......................... 365/201 |
| 2004/0008052 A1 * | 1/2004 | Sakaguchi et al. ........... 324/765 |
| 2004/0230870 A1 * | 11/2004 | Wang et al. .................... 714/30 |
| 2009/0097330 A1 * | 4/2009 | Yoko ........................ 365/189.05 |
| 2009/0172479 A1 | 7/2009 | Jang et al. |

FOREIGN PATENT DOCUMENTS

| JP | 2004-144488 A | 5/2004 | |
| JP | 2009-140122 A | 6/2009 | |
| JP | 2010085177 A | * 4/2010 | ........ G01R 31/3183 |
| KR | 10-2009-0069683 A | 7/2009 | |

* cited by examiner

*Primary Examiner* — Ajay Bhatia
*Assistant Examiner* — Dipakkumar Gandhi
(74) *Attorney, Agent, or Firm* — Lee & Morse, P.C.

(57) ABSTRACT

A device for testing a semiconductor memory device, the device including a code table that is configured to store at least a first received code and a second received code received via a host interface, a pattern generation engine that is configured to determine a third code based on at least one of the first and the second received codes stored in the code table and to output the third code, in response to a request to perform a test operation, received via the host interface, and a signal generation unit that is configured to generate control signals for testing the semiconductor memory device, based on the third code received from the pattern generation engine.

21 Claims, 14 Drawing Sheets

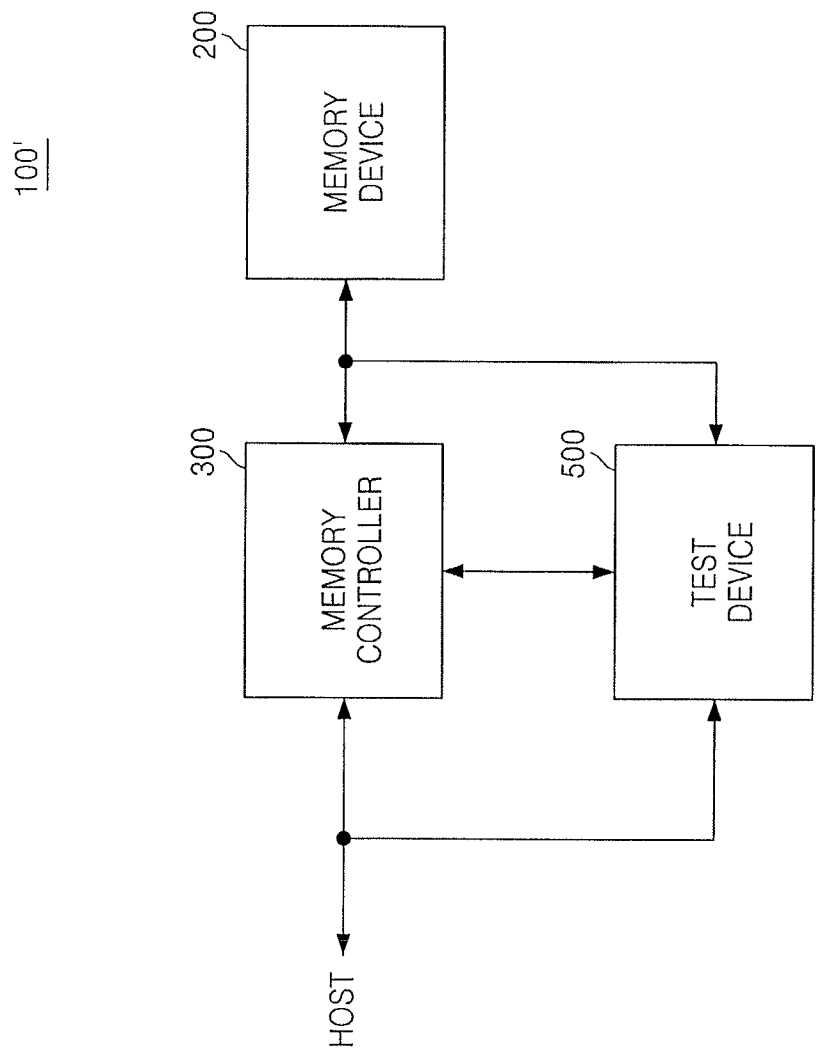

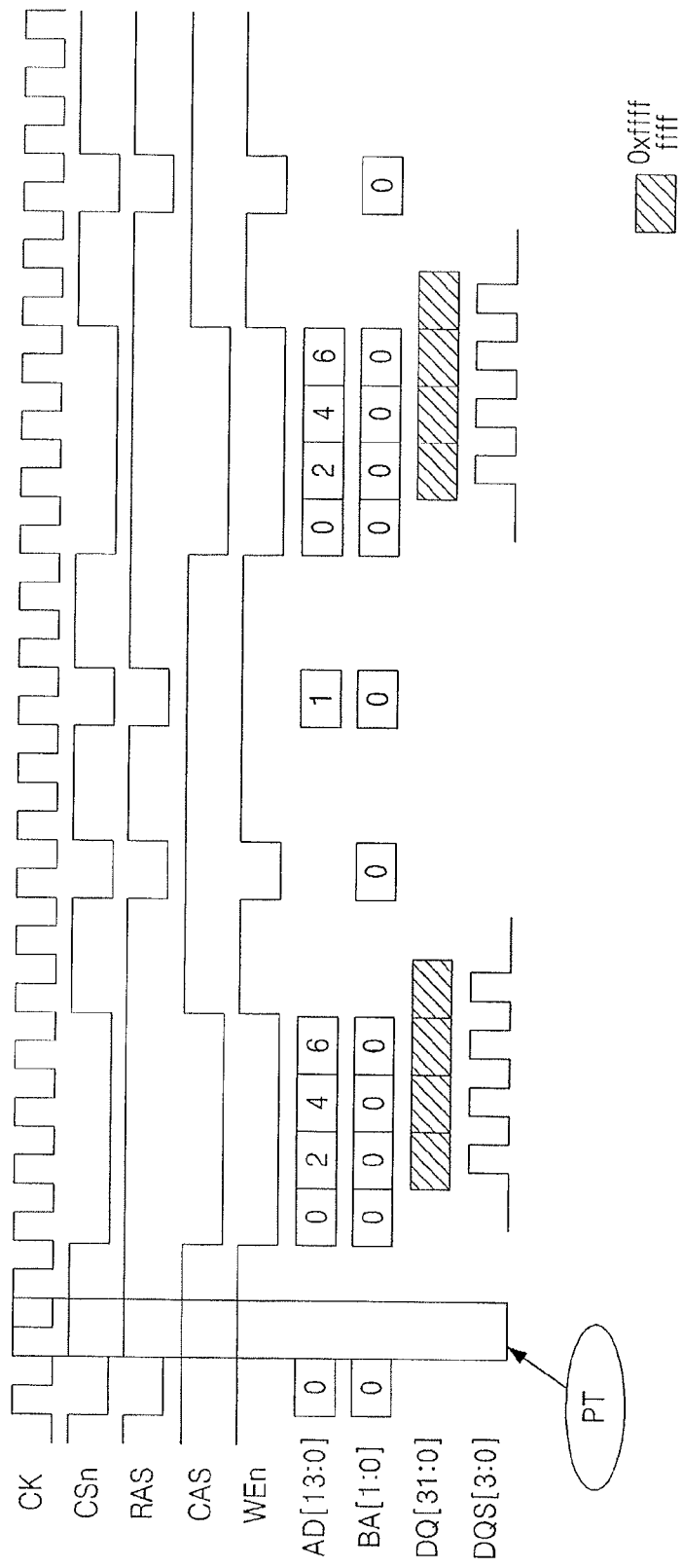

FIG. 7B

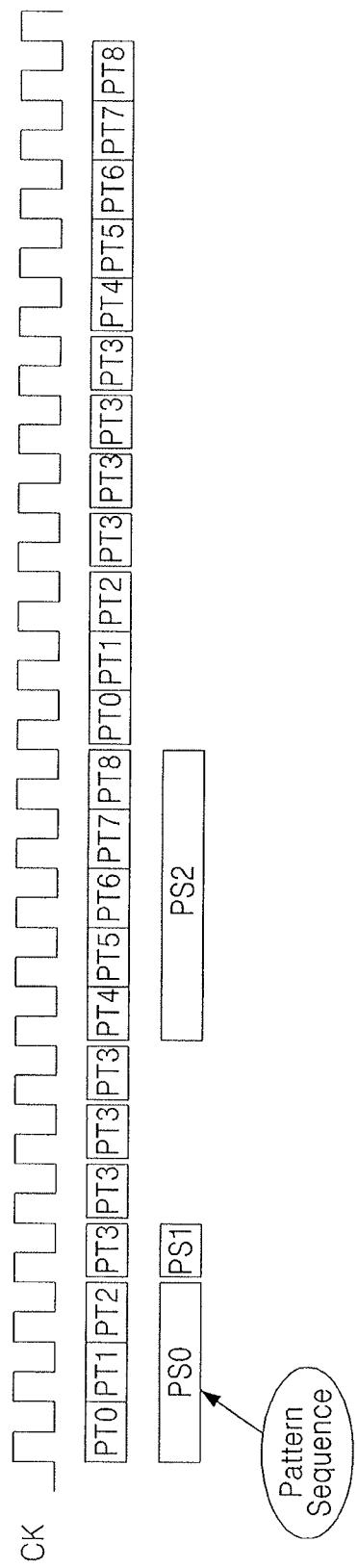

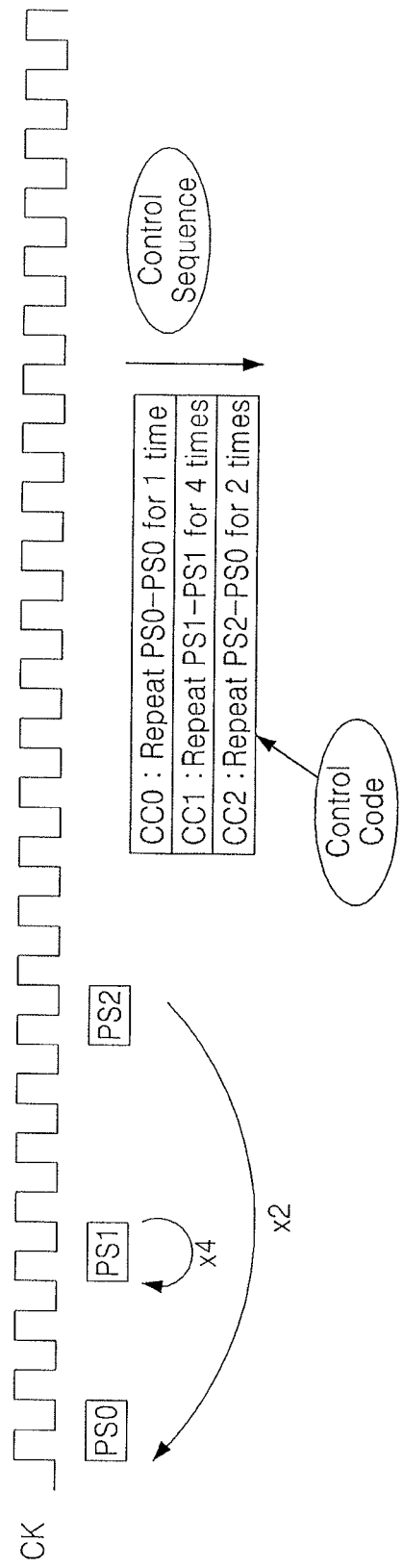

FIG. 8

| | PT0 | PT1 | PT2 | PT3 | PT4 | PT5 | PT6 | PT7 | PT8 |
|---|---|---|---|---|---|---|---|---|---|
| Direct Output | RAS | 0 | 1 | 1 | 1 | 1 | 1 | 0 | 1 | 1 |
| | CAS | 1 | 1 | 1 | 0 | 1 | 1 | 1 | 1 | 1 |
| | WEn | 1 | 1 | 1 | 0 | 1 | 1 | 0 | 1 | 1 |
| | ... | ... | ... | ... | ... | ... | ... | ... | ... | ... |
| Address Generator Control | R++ | ... | ... | C=C+2 | ... | ... | ... | ... | ... |
| | ... | ... | ... | ... | ... | ... | ... | ... | ... |
| Data Generator Control | ... | ... | ... | All 0 | ... | ... | ... | ... | ... |
| | ... | ... | ... | ... | ... | ... | ... | ... | ... |

FIG. 9

| Next Control Code | | CC0 | CC1 | CC2 |
|---|---|---|---|---|
| | | Noop | Loop 4 to CC1 | Loop 2 to CC0 |
| Pattern Sequence | Start PT | PT0 | PT3 | PT4 |
| | Length | 3 | 1 | 5 |

DEVICE AND METHOD FOR TESTING SEMICONDUCTOR DEVICE

CROSS-REFERENCE TO RELATED APPLICATIONS

This application claims the benefit of Korean Patent Application No. 10-2011-0055427, filed on Jun. 9, 2011, in the Korean Intellectual Property Office, the disclosure of which is incorporated herein in its entirety by reference.

BACKGROUND

1. Field

One or more embodiments relate to a device for testing a semiconductor device, and more particularly, to a testing device and a testing method that is configured to generate various test patterns for testing a semiconductor device.

2. Description of the Related Art

As a storage capacity and operating speed of a semiconductor memory device are increased, a number of transistors that may be included in the semiconductor memory device is also increased. Thus, a possibility that a defect will occur in the semiconductor memory device is growing. Accordingly, it is important to detect and sort out such a defect. A device for testing a semiconductor device (hereinafter referred to as the 'testing device'), which tests whether a manufactured semiconductor device, semiconductor chip, or semiconductor module has a defect are employed.

SUMMARY

One or more embodiments provide a device for testing a semiconductor memory device, the device including a code table configured to store at least a first received code and a second received code received via a host interface, a pattern generation engine configured to determine a third code based on at least one of the first and the second received codes stored in the code table and to output the third code, in response to a request to perform a test operation, received via the host interface, and a signal generation unit configured to generate control signals for testing the semiconductor memory device, based on the third code received from the pattern generation engine.

The first received code may include a control code, the second received code may include a pattern code, and the code table may include a control code table configured to store control codes received via the host interface, and a pattern code table configured to store pattern codes received via the host interface.

The pattern generation engine may be configured to control an operation of the signal generation unit by determining a next control code, based on a predetermined control sequence, determining a pattern code corresponding to the next control code, and outputting the determined pattern code to the signal generation unit, in response to the request to perform the test operation, received from the host interface, and the signal generation unit is configured to output a command, an address signal, and data for controlling the semiconductor memory device according to the determined pattern code, under control of the pattern generation engine.

The signal generation unit may include the pattern code table configured to output pattern codes under the control of the pattern generation engine, an address generator configured to generate a next-cycle address from a previous-cycle address of the semiconductor memory device, based on a pattern code received from the pattern code table, and a data generator configured to generate and to output a data pattern corresponding to a write operation of the semiconductor memory device and a data pattern corresponding to a read operation of the semiconductor memory device, based on the pattern code received from the pattern code table.

The device may include a comparator configured to receive the data pattern corresponding to the read operation as reference data from the data generator, to compare data output from the semiconductor memory device with the reference data, and to output a result of the comparing.

The device may include a diagnosis unit configured to determine whether the output data and the reference data are the same, based on the result of the comparing, and to output a result of the determining.

A test end signal may be output to the host interface when the result of the determining reveals that the output data and the reference data are the same, and row address information and column address information corresponding to the output data may be output to the host interface when the result of the determining reveals that the output data and the reference data are not the same.

The pattern code may include codes for determining a command, an address signal, and data regarding the semiconductor memory device.

The control code may include commands for determining a pattern sequence, and wherein the pattern sequence may include a command for determining a sequence for executing the pattern code.

The converter may be configured to receive a command from the pattern code table and an address signal from the address generator, and to output the received command and address signal as a command address signal to the semiconductor memory device.

The converter may be a low-power double data rate 2 (LPDDR2) memory.

One or more embodiments provide a method of testing a semiconductor memory device, the method including storing pattern codes and control codes received via a host interface, controlling an operation of a signal generation unit by determining a next control code, based on a predetermined control sequence, determining a pattern code corresponding to the next control code, and outputting the determined pattern code, in response to a request to perform a test operation, received from the host interface, outputting a command, an address signal, and data for controlling the semiconductor memory device, based on the determined pattern code, and generating and outputting a data pattern corresponding to a read operation of the semiconductor memory device, based on the output data.

The method may include outputting a test end signal to the host interface when a result of comparing data output from the semiconductor memory device with the data pattern corresponding to the read operation as reference data reveals that the output data and the reference data are the same, and outputting row address information and column address information corresponding to the output data to the host interface when the result of the comparing reveals that the output data and the reference data are not the same.

The pattern code may include codes for determining a command, an address signal, and data regarding the semiconductor memory device, the control code may include commands for determining a pattern sequence, and the pattern sequence may include a command for determining a sequence for executing the pattern code.

One or more embodiments provide a non-transitory recording medium for recording a program for executing a method of testing a semiconductor memory device, the method including storing pattern codes and control codes received via a host interface, controlling an operation of a signal generation unit by determining a next control code, based on a predetermined control sequence, determining a pattern code corresponding to the next control code, and outputting the determined pattern code, in response to a request to perform a test operation, received from the host interface, outputting a command, an address signal, and data for controlling the semiconductor memory device, based on the determined pattern code, and generating and outputting a data pattern corresponding to a read operation of the semiconductor memory device, based on the output data.

One or more embodiments provide a method of testing a semiconductor memory device, the method including receiving a plurality of codes including a first code and a second code via a host interface, determining a third code based on at least one of the received codes, outputting the third code, in response to a request to perform a test operation, received via the host interface, and generating control signals for testing the semiconductor memory device, based on the third code.

The first code and the second code may correspond to a control code and a pattern code, respectively, and the code table may include a control code table configured to store control codes received via the host interface, and a pattern code table configured to store pattern codes received via the host interface.

The method may include determining a next control code, based on a predetermined control sequence, determining a pattern code corresponding to the next control code, and outputting the determined pattern code, in response to the request to perform the test operation, received from the host interface, and outputting a command, an address signal, and data for controlling the semiconductor memory device according to the determined pattern code.

Determining a pattern code may include outputting a pattern code from a pattern code table based on the next control code, and the method may further include generating a next-cycle address from a previous-cycle address of the semiconductor memory device, based on the pattern code received from the pattern code table, and generating and outputting a data pattern corresponding to a write operation of the semiconductor memory device and a data pattern corresponding to a read operation of the semiconductor memory device, based on the pattern code received from the pattern code table.

The method may further include comparing the data pattern corresponding to the read operation with data output from the semiconductor memory device, and outputting a result of the comparing.

BRIEF DESCRIPTION OF THE DRAWINGS

Features will become apparent to those of ordinary skill in the art by describing in detail exemplary embodiments with reference to the attached drawings, in which:

FIGS. 3A and 3B illustrate schematic block diagrams of exemplary embodiments of the memory system of FIG. 1, each including a testing device;

FIGS. 7A to 7D illustrate signal diagrams of an exemplary embodiment of a method of generating pattern codes and control codes;

FIG. 8 illustrates a chart of an example of the pattern code table of FIG. 5;

FIG. 9 illustrates a chart of an example of the control code table of FIG. 6.

DETAILED DESCRIPTION

Figure 1:
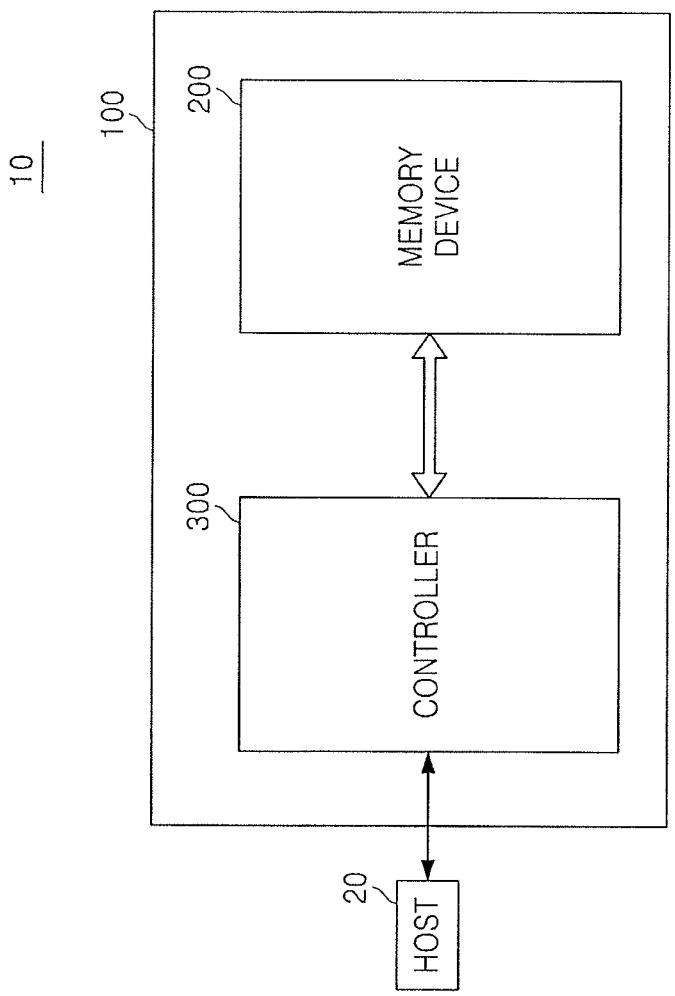
FIG. 1 illustrates a schematic block diagram of an exemplary embodiment of an electronic system.

Exemplary embodiments will be described more fully hereinafter with reference to the accompanying drawings, in which embodiments of the inventive concept are shown. Features may, however, be embodied in many different forms and should not be construed as limited to the embodiments set forth herein. Rather, these embodiments are provided so that this disclosure will be thorough and complete, and will fully convey the scope of the inventive concept those skilled in the art. In the drawings, the size and relative sizes of layers and regions may be exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a schematic block diagram of an electronic system 10. The electronic system 10 may include a memory system 100 and a host 20. The memory system 100 may include a controller 300 and a semiconductor memory device 200.

The host 20 may communicate with the memory system 100 by using an interface protocol such as a Peripheral Component Interconnect-Express (PCI-E), an Advanced Technology Attachment (ATA), a Serial ATA (SATA), a Parallel ATA (PATA), a Serial Attached SCSI (SAS), etc. Examples of the interface protocol used to communicate between the host 20 and memory system 100 are not limited thereto, and the interface protocol may be a Universal Serial Bus (USB), a Multi-Media Card (MMC), an Enhanced Small Disk Interface (ESDI), or Integrated Drive Electronics (IDE).

The electronic system 10 may be a system of, for example, a mobile device, a notebook computer, a desk-top computer, etc., but is not limited thereto.

The controller 300 may control overall operations of the memory system 100, and may control exchange of data between the host 20 and the semiconductor memory device 200. For example, the controller 300 may control the semiconductor memory device 200 to perform a read/write operation, in response to a request from the host 20. Also, the controller 300 may supply commands to the semiconductor memory device 200 so as to control an operation of the semiconductor memory device 200.

The semiconductor memory device 200 may be a semiconductor device on which a testing method according to an embodiment may be performed. Examples of the semiconductor memory device 200 include a volatile memory device and a nonvolatile memory device. In the description of exemplary embodiments herein, it is exemplarily assumed that the semiconductor memory device 200 is a DRAM including a memory cell array (not shown) in which a plurality of memory cells are arranged in a row direction and a column direction.

Examples of a volatile memory device include Dynamic Random Access Memory (DRAM), Static RAM (SRAM), Thyristor RAM (T-RAM), Zero Capacitor RAM (Z-RAM), and Twin Transistor RAM (TTRAM).

Examples of a nonvolatile memory device include Electrically Erasable Programmable Read-Only Memory (EEPROM), flash memory, Ferroelectric RAM (FeRAM or FRAM), Magneto-resistive RAM (MRAM), Phase-Change RAM (PRAM), Resistive RAM (RRAM), and Nano-RAM (NRAM).

Although FIG. 1 illustrates that the memory system 100 has a structure in which the controller 300 controls one semiconductor memory device 200, the memory system 100 may include one or more semiconductor memory devices 200.

Figure 2:
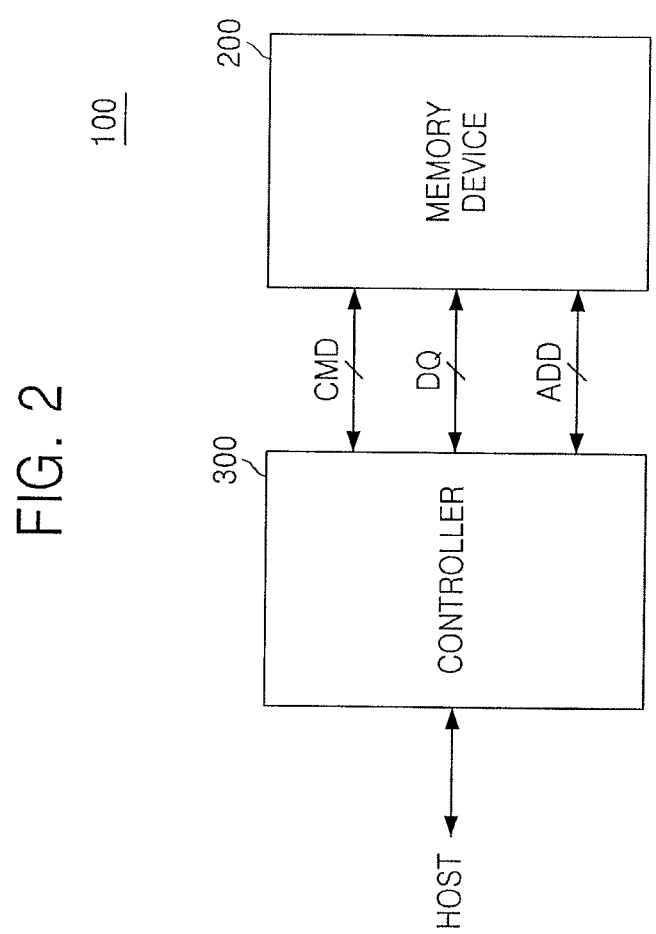
FIG. 2 illustrates a schematic block diagram of an exemplary embodiment of the memory system of FIG. 1.

FIG. 2 illustrates a schematic block diagram of an exemplary embodiment of the memory system 100 of FIG. 1. In the exemplary embodiment of FIG. 2, it is exemplarily assumed that the single semiconductor memory device 200 corresponds to the controller 300. Referring to FIG. 2, the controller 300 may input data to or output data from the semiconductor memory device 200 via a data DQ pin, in response to a request from the host 20 (see, FIG. 1).

The controller 300 may apply a command CMD for an active operation of the semiconductor memory device 200 and an address signal ADD to the semiconductor memory device 200. More particularly, e.g., the controller 300 may apply a command CMD for a write/read operation of the semiconductor memory device 200 and/or may apply a command CMD for a refresh operation of the semiconductor memory device 200 with an address signal ADD.

Figure 3B:
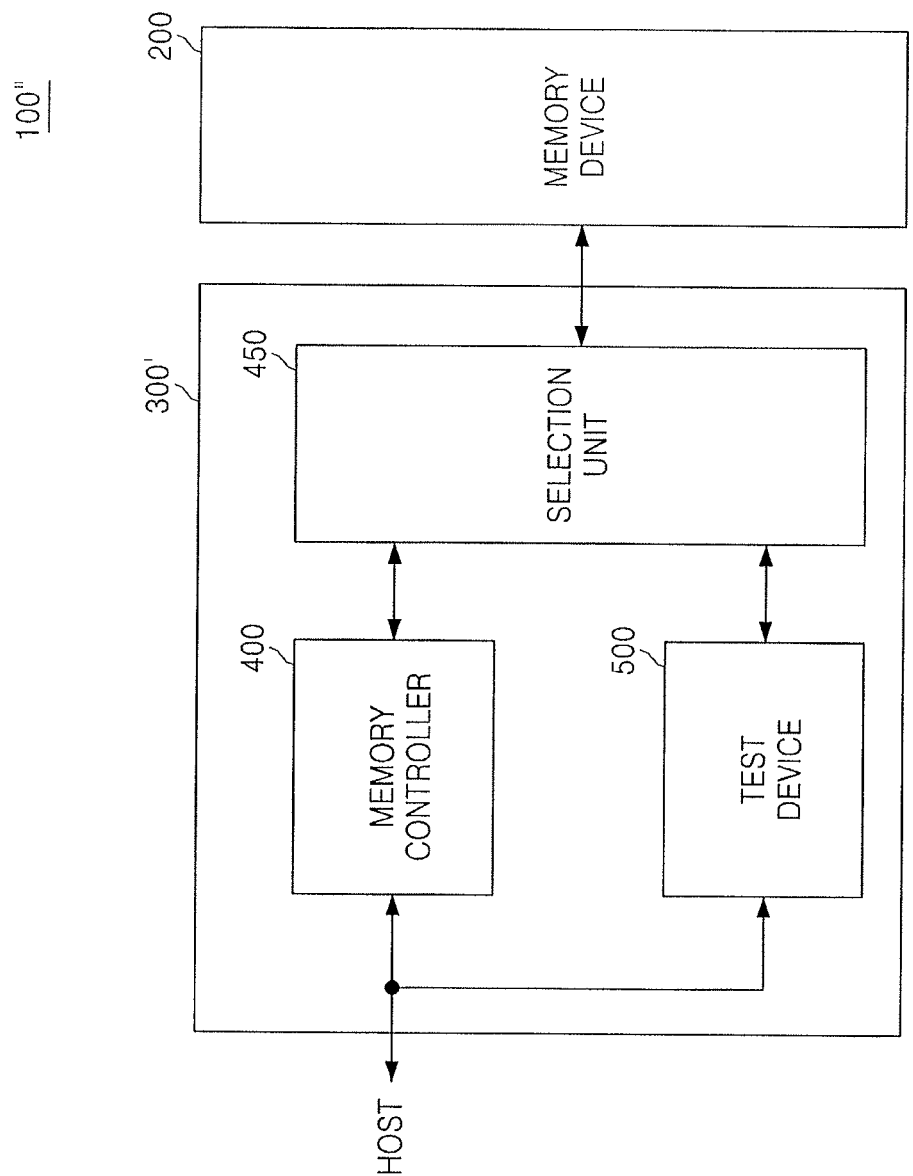

The memory system 100 may further include a device for testing a semiconductor memory device (hereinafter referred to as the 'testing device') (not shown) to determine whether states of a plurality of memory cells (not shown) included in the semiconductor memory device 200 are good. FIGS. 3A and 3B illustrate schematic block diagrams of exemplary embodiments of the memory system of FIG. 1, each including a test device.

FIG. 3A illustrates a schematic block diagram of an exemplary embodiment of a memory system 100' that includes a testing device 500. FIG. 3B illustrates a schematic block diagram of an exemplary embodiment of a memory system 100" that includes the testing device 500. In general, only differences between the exemplary memory systems 100', 100" of FIGS. 3A and 3B relative to the exemplary memory system 100 of FIG. 1 will be described below.

Referring to FIGS. 3A and 3B, the testing device 500 may test the semiconductor memory device 200. The testing device 500 may also test a semiconductor memory device (not shown), e.g., a DRAM or an SRAM, which is included in the memory controller 300.

Referring to FIG. 3B, in the memory system 100", a controller 300' may include a memory controller 400, a selection unit 450, and the testing device 500. The controller 300' may activate the memory controller 400 to control an operation of the semiconductor memory device 200 when the controller 300' receives a function mode control signal from the host 20, and may activate the testing device 500 to control a test operation performed on the semiconductor memory device 200 when the controller 300' receives a test mode control signal from the host 20.

Then, the memory controller 400 may control an operation of the semiconductor memory device 200 via the selection unit 450 according to the function mode control signal. The testing device 500 may control the test operation to be performed on the semiconductor memory device 200 via the selection unit 450 according to the test mode control signal.

The testing device 500 may be packaged separately from the memory controller 300, as illustrated in FIG. 3A, or may be packaged together with the memory controller 400 in such a manner that the testing device 500 and the memory controller 400 are installed in the same chip or in different chips, as illustrated in FIG. 3B.

FIGS. 3A and 3B respectively illustrate block diagrams of exemplary embodiments in which the testing device 500 is disposed outside the controller 300 or inside the memory controller 300, but embodiments are not limited thereto. For example, the controller 300 of FIG. 2 may be embodied to perform not only an operation of the memory controller 400 but also an operation of the testing device 500.

Figure 4:
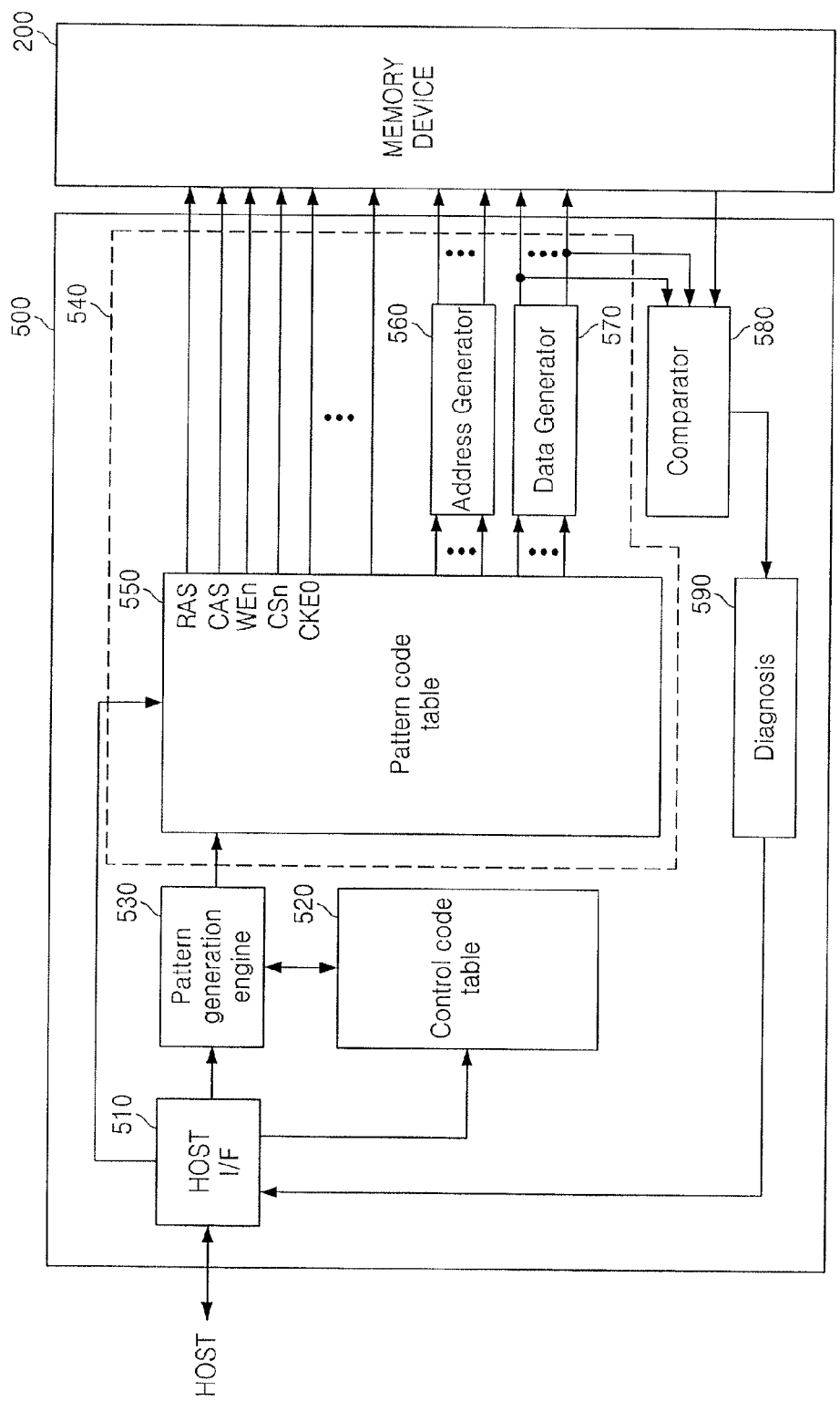
FIG. 4 illustrates a schematic block diagram of an exemplary embodiment of a testing device.
Figure 5:
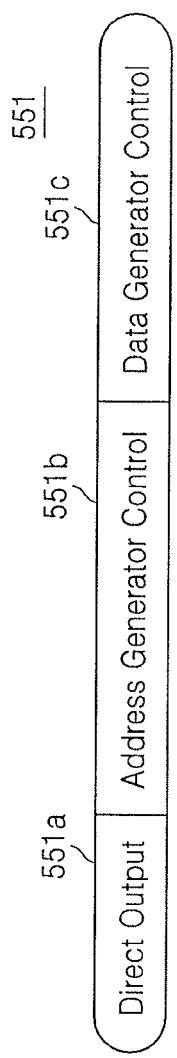
FIG. 5 illustrates a diagram for explaining the pattern code table of FIG. 4 according to an exemplary embodiment.
Figure 6:
FIG. 6 illustrates a diagram for explaining the control code table of FIG. 4 according to an exemplary embodiment.

FIG. 4 is a schematic block diagram of an exemplary embodiment of the testing device 500. FIG. 5 illustrates a schematic diagram for explaining a pattern code table 550 of FIG. 4 according to an exemplary embodiment. FIG. 6 illustrates a schematic diagram for explaining a control code table 520 of FIG. 4 according to an exemplary embodiment.

Referring to FIG. 4, the testing device 500 may include a host interface 510, the control code table 520, a pattern generation engine 530, a signal generation unit 540, a comparator 580, and a diagnosis unit 590. The signal generation unit 540 may include the pattern code table 550, an address generator 560, and a data generator 570. Exemplary operations of the testing device 500 are briefly described below.

The host interface 510 may receive pattern codes and control codes from the host 20, may transmit the control codes to the control code table 520, and may transmit the pattern codes to the signal generation unit 540.

The pattern codes may include codes for determining a command CMD, an address signal ADD, and data DQ related to the semiconductor memory device 200. The control codes may include commands for determining a pattern sequence.

The pattern sequence may be a command for determining a sequence for executing the pattern codes.

The control code table 520 may store the control codes received from the host interface 510, and may be embodied, for example, as a flip-flop. Referring to FIG. 6, in the control code table 520, an entry 521 may store a control code that includes a next control code 521a and a pattern sequence 521b. The control code table 520 may store a plurality of entries 521.

Referring back to FIG. 4, the pattern generation engine 530 may determine a next control code based on a predetermined control sequence regarding control codes, may determine a pattern code corresponding to the next control code, and may output the pattern code to the signal generation unit 540 to control an operation of the signal generation unit 540, in response to a request to perform a test operation, received from the host interface 510. In one or more embodiments, the pattern generation engine 530 may include a counter (not shown).

In other words, the pattern code table 550 may output a part of pattern codes stored therein as command signals RAS, CAS, WEn, CSn, CKE for controlling an operation of the semiconductor memory device 200, and may output another part of the pattern codes as bits for controlling the address generator 560 and the data generator 570, under control of the pattern generation engine 530.

The pattern code table 550 may be embodied in the form of a look-up table by using an SRAM. Referring to FIG. 5, in the pattern code table 550, an entry 551 may store pattern codes that include a direct output signal value 551a, a control signal value 551b for controlling the address generator 560, and a control signal value 551c for controlling the data generator 570. The pattern code table 550 may output the pattern codes to the semiconductor memory device 200, under control of the pattern generation engine 530.

Referring back to FIG. 4, the address generator 560 may generate a row address and a column address corresponding to the semiconductor memory device 200, based on the address signal ADD received from the pattern code table 550. In other words, the address generator 560 may generate a next-cycle address by performing an arithmetic operation or a logic operation on a previous-cycle address. In one or more embodiments, the address generator 560 may include an arithmetic logic device (not shown).

The testing device 500 may further include a converter (not shown) that may be configured to receive the command signals RAS, CAS, WEn, which may be included as part of the commands CMD, from the pattern code table 550 and the address signal ADD from the address generator 560, and to output the command signals RAS, CAS, and WEn and the address signal ADD as a command address signal CA to the semiconductor memory device 200.

For example, the converter may convert a part of the commands CMD and the address signal ADD received via ten pins [9:0] into the command address signal CA, and then output the command address signal CA to the semiconductor memory device 200. In one or more embodiments, the converter may be embodied as a Low-Power Double Data Rate 2 (LPDDR2) memory but is not limited thereto.

The data generator 570 may generate a data pattern for writing data to a memory cell corresponding to an address generated by the address generator 560 and may generate a data pattern for reading data from the semiconductor memory device 200, based on the pattern codes, and then, may output the data patterns to the semiconductor memory device 200.

In other words, the data generator 570 may write a plurality of pieces of data according to the data pattern, which is generated to correspond to a write operation of the semiconductor memory device 200, to the semiconductor memory device 200, and may read a plurality of pieces of data according to the data pattern, which is generated to correspond to a read operation of the semiconductor memory device 200, from the semiconductor memory device 200. In this case, the data generator 570 may output the data pattern, which is generated to read data from the semiconductor memory device 200 as reference data to the comparator 580.

The comparator 580 may compare data output from a memory cell of the semiconductor memory device 200 with the reference data and may output a result of the comparing to the diagnosis unit 590.

The diagnosis unit 590 may determine whether the output data and the reference data are the same, based on the result of comparing received from the comparator 580. If the output data and the reference data are the same, the diagnosis unit 590 may output a test end signal to the host interface 510 so that the testing of the semiconductor memory device 200 may end. If the output data and the reference data are not the same, the diagnosis unit 590 may output row address information and column address information corresponding to the memory cell of the semiconductor memory device 200 to the outside via the host interface 510.

In this case, under control of an operator, the diagnosis unit 590 may output information corresponding to a memory cell via the host interface 510 whenever data that is not the same as data stored in the data generator 570 is detected from the memory cell, and may simultaneously output information corresponding to all memory cells of the semiconductor memory device 200 via the host interface 510 when testing of all the memory cells ends. The operator may be a person who purchased or manufactured the testing device 500.

FIGS. 7A to 7D illustrate signal diagrams of an exemplary method of generating pattern codes and control codes. FIG. 8 illustrates a chart of an example of the pattern code table of FIG. 5. FIG. 9 illustrates a chart of an example of the control code table of FIG. 6. Here, it is exemplarily assumed that the semiconductor memory device 200 is DRAM.

Figure 7B:
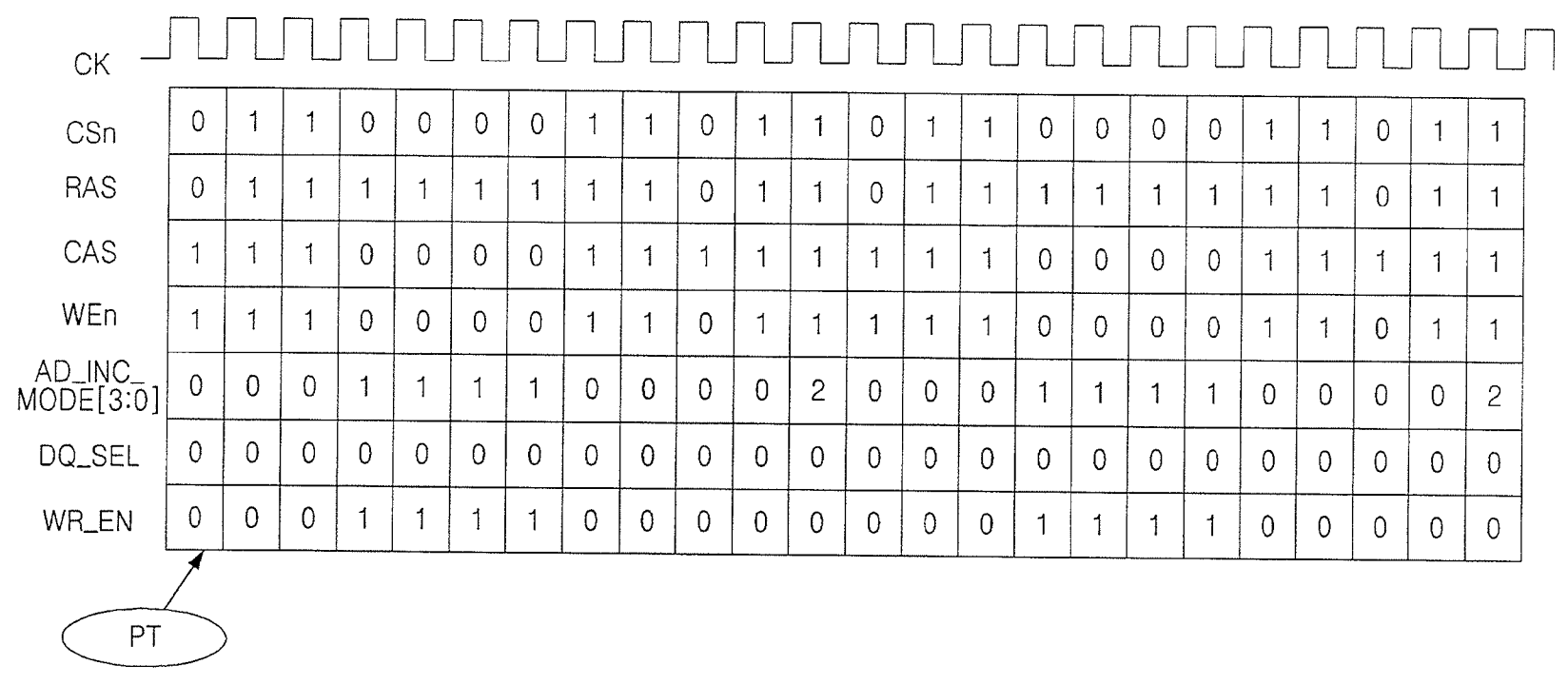

Referring to FIG. 7A, an operator may generate bits of pulses corresponding to commands, an address signal, and data according to a clock signal CK included in each cycle of the semiconductor memory device 200, as pattern codes PT, as illustrated in FIG. 7B.

In this case, operations of a plurality of memory cells included in the semiconductor memory device 200 may be controlled by outputting three bits of commands CSn, RAS, and CAS from among the pattern codes PT to the semiconductor memory device 200. For example, the semiconductor memory device 200 may perform an active operation when an output pattern code PT is '001', may perform no operation Noop when the output pattern code PT is '111', may perform a read/write operation when the output pattern code PT is '010', and may perform a precharge operation when the output pattern code PT is '001'.

The operator may generate control codes CC including a pattern sequence PS as illustrated in FIGS. 7C and 7D, based on the pattern codes PT. For example, the pattern code PT '001' corresponding to the active operation of the semiconductor memory device 200 may be defined as 'PT0', and the pattern code PT '111' corresponding to the no operation Noop performed after the active operation is performed may be defined as 'PT1' and 'PT2'. The pattern codes PT0, PT1, and PT2 may be defined together as a pattern sequence PS0. The pattern code PT '010' corresponding to the read/write operation of the semiconductor memory device 200 may be defined as 'PT3'. The pattern code PT3 may be defined as a pattern sequence PS1.

As described above, the operator may generate a pattern sequence PS corresponding to a current pattern code PT, and generate a control code CC by analyzing a number of times that the pattern sequence PS is executed. For example, during a cycle of the semiconductor memory device 200, a control code CC for executing the pattern sequence PS0 once may be defined as 'CC0', a control code CC for executing the pattern sequence PS1 four times may be defined as 'CC1', and a control code CC for executing a pattern sequence PS2 once and executing the pattern sequences PS0 to PS2 twice may be defined as 'CC2'.

The pattern codes PT and the control codes CC generated by the operator may be respectively stored in the pattern code table 550 and the control code table 520 of FIG. 4, as illustrated in FIGS. 8 and 9. Referring to FIGS. 4 and 8, the pattern code table 550 stores a direct output signal value received via the host interface 510, a first control signal value for controlling the address generator 560, and a second control signal value for controlling the data generator 570. In the pattern code table 550, signal values corresponding to operations of the semiconductor memory device 200 may be stored to be identified by using the pattern codes PT.

A part of the pattern codes PT stored in the pattern code table 550, the direct output signal value (e.g., 551a of FIG. 5), may be input as a command to the semiconductor memory device 200 in order to control an operation of the semiconductor memory device 200, under control of the pattern generation engine 530.

Also, another part of the pattern codes PT stored in the pattern code table 550, the first control signal value (e.g., 551b of FIG. 5), may be output to control the address generator 560 to generate an address to be output to the semiconductor memory device 200, and the second control signal value (e.g., 551c of FIG. 5) may be output to control the data generator 570 to generate a data pattern for performing the read/write operation on the semiconductor memory device 200, under control of the pattern generation engine 530.

For example, in order to allow the semiconductor memory device 200 to perform the active operation under control of the pattern generation engine 530, the pattern code table 550 may output the pattern code PT0 '011' corresponding to the active operation, as command signals RAS, CAS, and WEn to be input to the semiconductor memory device 200. In this case, the pattern code table 550 may output a control signal to the address generator 560 to increase a row address by one bit so that the plurality of memory cells in the semiconductor memory device 200 may be sequentially tested.

In order to allow the semiconductor memory device 200 to perform the read/write operation, under control of the pattern generation engine 530, the pattern code table 550 may output the pattern code PT3 '100' corresponding to the read/write operation, as the command signals RAS, CAS, and WEn to be input to the semiconductor memory device 200. At the same time, the pattern code table 550 may output a control signal to the address generator 560 and the data generator 570 to increase column addresses corresponding to row addresses, which are increased by one bit, by two bits so that the read/write operation is sequentially performed on the plurality of memory cells in the semiconductor memory device 200. Then, the data generator 570 may read '0' from or write '0' to all of memory cells corresponding to the row and column addresses.

Referring to FIG. 9, the control code table 520 may store control codes CC each including a next control code and a pattern sequence received via the host interface 510.

If the pattern generation engine 530 requests a control code CC, based on a predetermined control sequence, then the control code table 520 may output information corresponding to a starting pattern code PT and a pattern code length regarding the pattern code table 550, and a next control code CC, which are related to the requested control code CC, to the pattern generation engine 530.

Then, the pattern generation engine 530 may determine the next control code CC based on the information received from the control code table 520, and may control an operation of the pattern code table 550 according to a pattern code PT corresponding to the next control code CC.

For example, the pattern generation engine 530 may request the control code table 520 to provide a control code CC0, may receive the control code CC0 from the control code table 520, and may control an operation of the pattern code table 550 to execute pattern codes 'PT0' to 'PT2' once, based on the control code CC0.

In this case, a pattern sequence PS may be stored to include a starting pattern code PT and a pattern code length as illustrated in FIG. 9 or to include the starting pattern code PT and an ending pattern code PT, but the inventive concept is not limited thereto.

Pattern codes PT and control codes CC generated by an operator may be respectively stored in the pattern code table 550 and the control code table 520, and the testing device 500 may test the semiconductor memory device 200, based on the pattern codes PT and the control codes CC.

In the exemplary testing method that may be performed by the testing device 500 the method was described as receiving two codes, e.g., a control code and a pattern code, from the host 20 and generating a test pattern based on the two codes, but embodiments are not limited thereto, e.g., may receive more than two codes.

In other words, the testing device 500 may generate a test pattern by receiving at least two codes from the host 20, and may thus test the semiconductor memory device 200 based on the at least two codes. The at least two codes may generate the test pattern based on different codes or same codes.

Figure 10:
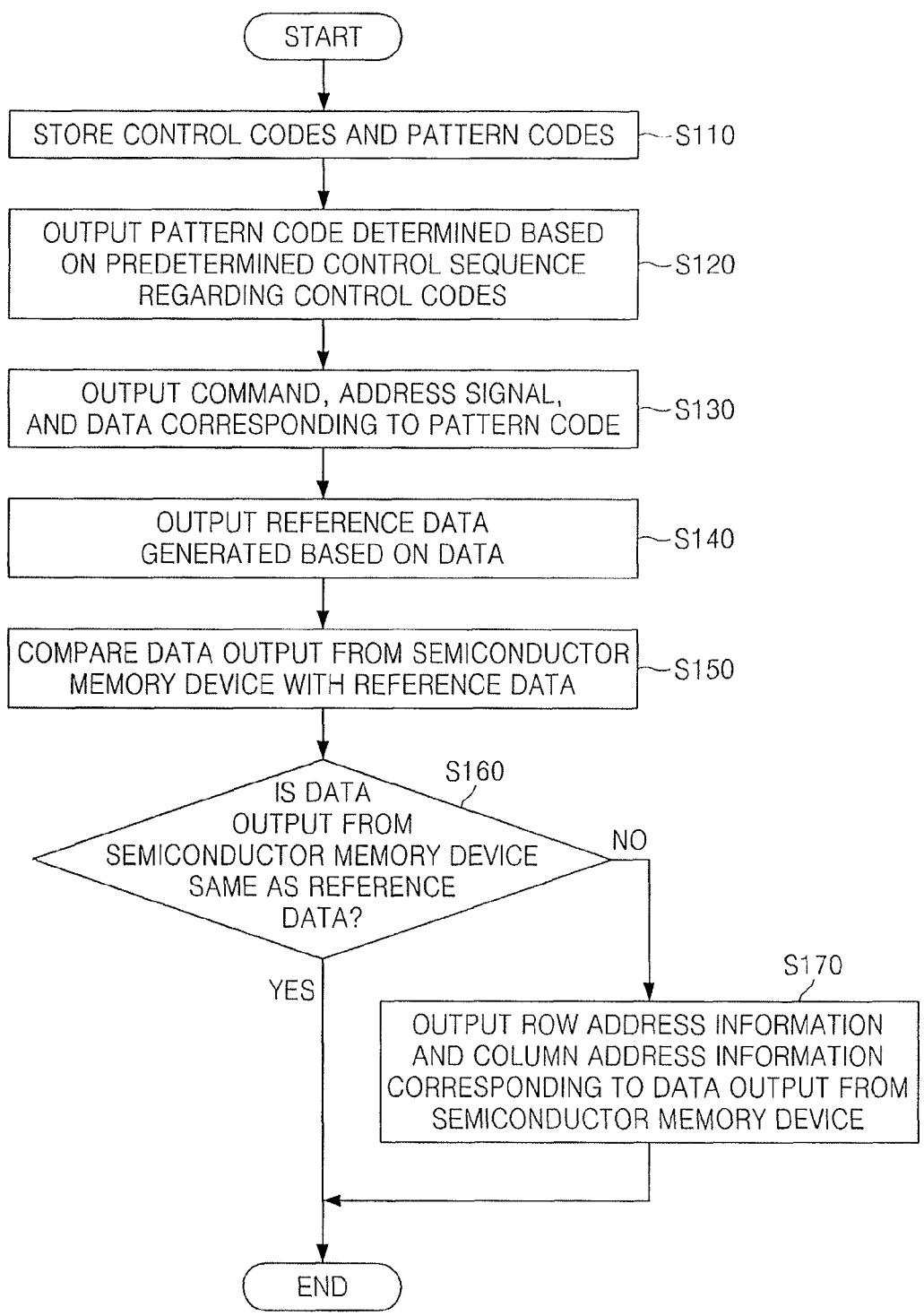
FIG. 10 illustrates a flowchart of an exemplary embodiment of a testing method performed by a testing device.

FIG. 10 illustrates a flowchart of an exemplary embodiment of a test method performed by a test device. Referring to FIGS. 1 to 10, the control code table 520 and the pattern code table 550 respectively store control codes and pattern codes received from the host interface 510 (S110).

When receiving a request to perform a test operation from the host interface 510, the pattern generation engine 530 determines a next control code, based on a predetermined control sequence regarding the control codes stored in the control code table 520, determines a pattern code corresponding to the next control code, and then outputs the pattern code to the signal generation unit 540 (S120).

Then, the signal generation unit 540 may output a command, an address signal, and data corresponding to the pattern code received from the pattern generation engine 530 (S130). The, the data generator 570 may generate a data pattern for performing a read operation of the semiconductor memory device 200, based on the data received from the signal generation unit 540, and may output the data pattern as reference data to the comparator 580 (S140).

Then, the comparator 580 may compare data output from the semiconductor memory device 200 with the reference data (S150). Then, the diagnosis unit 590 may determine whether the output data and the reference data are the same, based on a result of the comparing received from the comparator 580 (S160).

Thereafter, the diagnosis unit 590 may output a test end signal to the host interface 510 so that the testing of the semiconductor memory device 200 may end when the output data and the reference data are the same, and may output row address information and column address information corresponding to the output data to the outside via the host interface 510 when the output data and the reference data are not the same (S170).

As described above, a testing device may be used to test a semiconductor device that tests whether a manufactured semiconductor device, semiconductor chip, or semiconductor module has a defect. Such a testing device may determine whether a semiconductor memory device has a defect by writing a test pattern to a plurality of memory cells of the semiconductor memory device, reading data from the plurality of memory cells, and comparing the read data with data written to the plurality of memory cells in order to determine whether the write data and the read data are the same.

In such a testing device, the test pattern may be generated based on a command stored in a memory device included in the testing device. In such a conventional testing device, since the test pattern is generated according to a 1-level command, a complicated command is needed to generate various test patterns. When using such a conventional testing device, a storage capacity of the memory device should be greatly increased to store such a complicated command. Thus, in such conventional cases, costs of installing a memory device in a testing device are increased, and the testing device is not likely to be installed in a logic semiconductor, e.g., a memory controller.

As described above, in one or more embodiments of a testing method performed by a testing device employing one or more features described herein, control codes and pattern codes are separately stored to test a semiconductor memory device. Thus, one or more embodiments of a testing device or a testing method employing one or more features described herein enable various test patterns to be generated using a smaller storage capacity of memory.

One or more embodiments provide a testing device and method configured to produce various test patterns based on a multi-level command. In one or more embodiments, commands may be reused, and a size of memory that stores the commands may be reduced relative to conventional testing devices.

One or more embodiments may be embodied as hardware, software or combinations of hardware and software. One or more embodiments may also be embodied as computer-readable codes on a computer-readable medium, e.g., all computer readable media except for a transitory, propagating signal. The computer-readable recording medium may be any data storage device that can store data as a program which can be thereafter read by a computer system. Examples of the computer-readable recording medium include read-only memory (ROM), random-access memory (RAM), CD-ROMs, magnetic tapes, floppy disks, optical data storage devices, etc. The computer-readable recording medium can also be distributed over network coupled computer systems so that the computer-readable code is stored and executed in a distributed fashion. It is understood that functional programs, codes, and code segments to accomplishing one or more features of embodiments may be easily construed by programmers skilled in the art to which embodiments pertain.

Exemplary embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present inventive concept as set forth in the following claims.

What is claimed is:

1. A device for testing a semiconductor memory device, the device comprising:
a code table configured to store at least a first received code and a second received code received via a host interface;
a pattern generation engine configured to determine a third code based on at least one of the first and the second received codes stored in the code table and to output the third code, in response to a request to perform a test operation, received via the host interface; and
a signal generator configured to generate control signals for testing the semiconductor memory device, based on the third code received from the pattern generation engine, wherein the first received code designates a combination of second codes including the second received code arranged in a predetermined sequence, and wherein the second codes correspond to different operations to be performed on the semiconductor memory device for the test operation.

2. The device as claimed in claim 1, wherein:
the first received code includes a control code,
the second received code includes a pattern code, and
the code table includes:
a control code table configured to store control codes received via the host interface; and
a pattern code table configured to store pattern codes received via the host interface.

3. The device as claimed in claim 2, wherein:
the pattern generation engine is configured to control an operation of the signal generator by determining a next control code, based on a predetermined control sequence, determining a pattern code corresponding to the next control code, and outputting the determined pattern code to the signal generator, in response to the request to perform the test operation, received from the host interface, and
the signal generator is configured to output a command, an address signal, and data for controlling the semiconductor memory device according to the determined pattern code, under control of the pattern generation engine.

4. The device as claimed in claim 3, wherein the signal generator comprises:
the pattern code table configured to output pattern codes under the control of the pattern generation engine;
an address generator configured to generate a next-cycle address from a previous-cycle address of the semiconductor memory device, based on a pattern code received from the pattern code table; and
a data generator configured to generate and to output a data pattern corresponding to a write operation of the semiconductor memory device and a data pattern corresponding to a read operation of the semiconductor memory device, based on the pattern code received from the pattern code table.

5. The device as claimed in claim 4, further comprising
a comparator configured to receive the data pattern corresponding to the read operation as reference data from the data generator, to compare data output from the semiconductor memory device with the reference data, and to output a result of the comparing.

6. The device as claimed in claim 5, further comprising
a diagnosis unit configured to determine whether the output data and the reference data are the same, based on the result of the comparing, and to output a result of the determining.

7. The device as claimed in claim 6, wherein a test end signal is output to the host interface when the result of the determining reveals that the output data and the reference data are the same, and row address information and column address information corresponding to the output data are output to the host interface when the result of the determining reveals that the output data and the reference data are not the same.

8. The device as claimed in claim 3, further comprising
a converter configured to receive a command from the pattern code table and an address signal from an address generator, and to output the received command and address signal as a command address signal to the semiconductor memory device.

9. The device as claimed in claim 8, wherein the converter is a low-power double data rate 2 (LPDDR2) memory.

10. The device as claimed in claim 2, wherein the pattern code includes codes for determining a command, an address signal, and data regarding the semiconductor memory device.

11. The device as claimed in claim 10, wherein the control code includes commands for determining a pattern sequence, and wherein the pattern sequence includes a command for determining a sequence for executing the pattern code.

12. The device as claimed in claim 1, wherein the first received code includes information indicating a number of times the combination of second codes are to be executed in the predetermined sequence.

13. A method of testing a semiconductor memory device, the method comprising:
storing pattern codes and control codes received via a host interface;
controlling an operation of a signal generator by determining a next control code, determining one or more pattern codes corresponding to the next control code, and outputting the one or more determined pattern codes, in response to a request to perform a test operation, received from the host interface;
outputting a command, an address signal, and data for controlling the semiconductor memory device, based on the one or more determined pattern codes; and
generating and outputting a data pattern corresponding to a read operation of the semiconductor memory device, based on the output data, wherein the next control code designates a combination of pattern codes arranged in a predetermined sequence, and wherein the pattern codes correspond to different operations to be performed on the semiconductor memory device for the test operation.

14. The method as claimed in claim 13, further comprising:
outputting a test end signal to the host interface when a result of comparing data output from the semiconductor memory device with the data pattern corresponding to the read operation as reference data reveals that the output data and the reference data are the same, and
outputting row address information and column address information corresponding to the output data to the host interface when the result of the comparing reveals that the output data and the reference data are not the same.

15. The method as claimed in claim 13, wherein:
the pattern code includes codes for determining a command, an address signal, and data regarding the semiconductor memory device, and
the control code includes commands for determining a pattern sequence, and
the pattern sequence includes a command for determining a sequence for executing the pattern code.

16. A non-transitory recording medium for recording a program for executing the method as claimed in claim 13.

17. A method of testing a semiconductor memory device, the method comprising:
receiving a plurality of codes including a first code and a second code via a host interface;
determining a third code based on at least one of the received codes;
outputting the third code, in response to a request to perform a test operation, received via the host interface; and
generating control signals for testing the semiconductor memory device, based on the third code, wherein the first code designates a combination of second codes including the second code arranged in a predetermined sequence, and wherein the second codes correspond to different operations to be performed on the semiconductor memory device for the test operation.

18. The method as claimed in claim 17, wherein
the first code and the second code correspond to a control code and a pattern code, respectively, and a code table includes:
a control code table configured to store control codes received via the host interface; and
a pattern code table configured to store pattern codes received via the host interface.

19. The method as claimed in claim 17, further comprising:
determining a next control code, based on a predetermined control sequence,
determining a pattern code corresponding to the next control code,
outputting the determined pattern code, in response to the request to perform the test operation, received from the host interface, and
outputting a command, an address signal, and data for controlling the semiconductor memory device according to the determined pattern code.

20. The method as claimed in claim 19, wherein determining the pattern code includes outputting the pattern code to the pattern code table based on the next control code, and the method further includes:
generating a next-cycle address from a previous-cycle address of the semiconductor memory device, based on the pattern code received from the pattern code table; and
generating and outputting a data pattern corresponding to a write operation of the semiconductor memory device and a data pattern corresponding to a read operation of the semiconductor memory device, based on the pattern code received from the pattern code table.

21. The method as claimed in claim 20, further comprising:
comparing the data pattern corresponding to the read operation with data output from the semiconductor memory device; and
outputting a result of the comparing.

* * * * *